United States Patent
Ng

(10) Patent No.: US 7,129,638 B2
(45) Date of Patent: Oct. 31, 2006

(54) LIGHT EMITTING DEVICES WITH A PHOSPHOR COATING HAVING EVENLY DISPERSED PHOSPHOR PARTICLES AND CONSTANT THICKNESS

(75) Inventor: Ke Yean Ng, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 199 days.

(21) Appl. No.: 09/924,653

(22) Filed: Aug. 8, 2001

(65) Prior Publication Data

US 2002/0021085 A1    Feb. 21, 2002

(30) Foreign Application Priority Data

Aug. 9, 2000    (MY)    ................ PI20003619

(51) Int. Cl.
*H05B 33/00*    (2006.01)
*H01L 51/50*    (2006.01)

(52) U.S. Cl. .................. 313/512; 313/485; 257/98; 257/100

(58) Field of Classification Search ............ 313/499, 313/512, 498, 501, 502, 113, 506, 485; 315/169.3; 257/99, 98, 100
See application file for complete search history.

(56) References Cited

U.S. PATENT DOCUMENTS

| | | | | |
|---|---|---|---|---|
| 3,555,335 A | * | 1/1971 | Johnson | ...................... 313/499 |
| 5,019,746 A | * | 5/1991 | Merg | ........................... 313/512 |
| 5,534,718 A | | 7/1996 | Chang | |
| 5,813,753 A | * | 9/1998 | Vriens et al. | ................ 313/512 |
| 5,847,507 A | | 12/1998 | Butterworth et al. | ........ 313/512 |
| 5,959,316 A | * | 9/1999 | Lowery | ......................... 257/99 |
| 6,066,861 A | * | 5/2000 | Hohn et al. | .................... 257/99 |
| 6,340,824 B1 | * | 1/2002 | Komoto et al. | ................ 257/99 |
| 6,417,019 B1 | * | 7/2002 | Mueller et al. | ................ 257/98 |
| 6,521,915 B1 | * | 2/2003 | Odaki et al. | ................... 257/98 |
| 6,717,355 B1 | * | 4/2004 | Takahashi et al. | ........... 313/503 |

FOREIGN PATENT DOCUMENTS

| | | |
|---|---|---|
| DE | 29804149 U1 | 6/1998 |
| EP | 1020935 A | 7/2000 |
| GB | 1497115 | 1/1978 |
| GB | 2221570 A | 2/1990 |
| JP | 62-235787 A | * 10/1987 |

OTHER PUBLICATIONS

Patent Abstracts Of Japan, Inventor(s): Kiyohashi Kazuo, Title: "Lead Frame For Light Emitting Diode", Publication Date: Sep. 22, 1980.

Patent Abstracts Of Japan, Inventoe(s): Shimizu Yoshinori, Title: "Light-Emitting Diode And Its Forming Method", Publication Date: Feb. 12, 1999.

(Continued)

*Primary Examiner*—Mariceli Santiago

(57) ABSTRACT

A light emitter, being an LED or laser diode, is disposed above a base substrate, and a coating material containing a dye compound, such as an epoxy material containing a fluorescent or luminescent substance, is applied over the light emitter. The base substrate includes a raised platform on which the light emitter is mounted, such that the light emitter is supported at a prescribed distance from the surrounding base substrate. The device allows the dye compound within the coating material to settle into the recessed base substrate surrounding the platform and leave the sides of the light emitter able to retain only a coating of the dye comparable in thickness to that coating remaining on the upper surface of the light emitter, in order to improve the uniformity of the light distribution pattern emitted from the device.

13 Claims, 2 Drawing Sheets

OTHER PUBLICATIONS

Patent Abstracts Of Japan, Inventor(s): Runaraito KK, Title: Light Emitting Diode And Manufacture Thereof, Publication Date: Nov. 14, 2000, (No Translation).

Copy Of The European Search Report Dated Jun. 11, 2003.

* cited by examiner

LIGHT EMITTING DEVICES WITH A PHOSPHOR COATING HAVING EVENLY DISPERSED PHOSPHOR PARTICLES AND CONSTANT THICKNESS

FIELD OF THE INVENTION

The present invention concerns light emitting devices and, more specifically, light emitting diode devices, and methods of construction of such devices.

BACKGROUND TO THE INVENTION

Light emitting diodes (LEDs) are very well known in solid state illuminating devices, commonly used for illuminators, display components and indication devices. Early LEDs provided radiation in the high frequency end of the visible spectrum, namely as red light. More recently, LEDs have been developed that operate efficiently in the higher frequency portion of the visible spectrum, namely to emit blue light. Such devices employ layers of luminescent or fluorescent materials, for example phosphor, overlying the LED die and serving to shift the wavelength of the light emitted from the die, the radiation being re-emitted from the intermediate phosphor layer at a longer wavelength.

As an example, a blue LED such as a gallium nitride (GaN) die, can be used to provide a white LED lamp by positioning a layer of phosphor dye over the LED die. This is then encapsulated in a standard clear epoxy lens, and the LED then connected and powered in the conventional manner. The phosphor layer serves to absorb, shift, and re-emit a broad band yellow-green light, as well as some unabsorbed original blue light which passes through the phosphor layer. The combination radiation is emitted through the epoxy lens and results to a viewer in a perceived emission of white light.

Various types of fluorescent material have been tested and used in providing a range of colour mixtures, and devices are now available that can produce light in almost any desired colour.

A further approach has been developed in the prior art for employing such fluorescent or luminescent materials in LED devices. In U.S. Pat. No. 5,847,507 (Hewlett Packard Co.), a process and apparatus is described in which a lens incorporating a fluorescent dye is over-moulded to a short wavelength light emitter such as a blue LED or a laser diode placed within a reflector cup. The concentration of the dye within the lens can be varied to control the extent of a region within the lens where the majority of the radiation is re-emitted, such that the remaining portion of the lens can fulfil its primary duty of focussing the light.

The dye used for "doping" the epoxy material in constructing this type of LED device can be provided by way of an inorganic dye material, generally a powder, or by way of an organic dye material, generally a liquid. Studies by the inventor of the present invention have indicated that the use of organic dyes appears to be more efficient than that of inorganic compounds, largely because the powder particles tend to settle within the hardening epoxy material, so tending to affect the homogeneity of the phosphor-containing portion of the lens. These studies have shown that the LED devices so produced can therefore suffer from problems of non-uniformity in their colour. Portions of the radiation pattern of the LED as perceived can differ in colour from other portions, and in particular, the outer part of the radiation pattern can tend to differ from the colour of the on-axis radiation emitted.

As an example, in the construction of an LED device consisting of a blue LED with YAG:$Ce^{3+}$ phosphor, a yellow ring can be seen around the perimeter of the radiation pattern. Therefore, viewing the lamp on-axis and off-axis can result in perception of different colours. The reason for this artefact has been found to be that the quantity of luminescent or fluorescent material surrounding the LED die tends to be non-uniform, due to the method of construction of such devices. The doped epoxy material is conventionally applied over the LED die in a quantity such that it fills the reflector cup in which the die is mounted. The phosphor particles contained in the epoxy material then settle around the contours of the LED die and reflector cup as the epoxy cures. Due to the contours of the device, and particularly due to the generally annular space around the LED die, excessive dye material tends to collect at the sides of the LED, in comparison with that which remains overlying the surface of the LED. For this reason, the wavelength shift of the light emitted from the device when seen from the side differs from that when viewed along a line parallel to the central axis.

It is an object of the present invention to address the aforementioned drawbacks and to provide an improved apparatus and method in the field of light emitting devices.

SUMMARY OF THE INVENTION

The invention provides, in a first aspect, a light emitting device comprising a light emitter disposed above a base substrate and a coating material applicable over the light emitter, the base substrate having a projecting platform on which the light emitter is mounted, such that the projecting platform supports the light emitter at a prescribed distance from the surrounding base substrate.

The projecting platform may be formed as an integral part of the base substrate, or may be provided as a discrete component, attachable to said base substrate, in which case the projecting platform and the base substrate may be fabricated from different materials.

In a preferred form the base substrate comprises a planar base portion and a sloping wall portion to provide reflection of light emitted by said light emitter. The sloping wall is preferably of frusto-conical form surrounding the projecting platform, so as to provide a generally annular planar base portion around said projecting platform.

Preferably, the base substrate is coated with a reflective medium, such as silver, and this reflective coating may also cover the surface of the projecting platform.

The novel construction of the device of the invention provides, then, a lowered portion of the base substrate relative to the base of the light emitter, into which lowered portion excess applied dye material is able to flow. This allows the layer of dye material which remains over the sides of the light emitter to assume a lower thickness than would otherwise be possible, and ideally to take an approximately uniform thickness over the LED die, so reducing the variation in energy transmission across the light emitting device. Although not limited thereto, the device of the invention has particular application to doped LED construction using inorganic phosphor dye material.

In a second aspect, the invention provides a method of providing a light emitting device, the method comprising the steps of:

providing a base substrate having a projecting platform;

providing a light emitter having a top surface and side surfaces;

positioning the light emitter on said projecting platform such that the light emitter is supported at a prescribed distance from the surrounding base substrate;

applying over the light emitter a settable coating material containing a dye compound in such a manner that, when the coating material has set, the dye compound covering the light emitter is of a comparable thickness over the side surfaces as over the top surface of the light emitter, excess dye compound being deposited over said surrounding base substrate.

BRIEF DESCRIPTION OF THE DRAWINGS

The invention will now be described in more detail by way of non-limiting exemplification with reference to the accompanying drawings, in which.

DETAILED DESCRIPTION OF THE INVENTION

Figure 1:
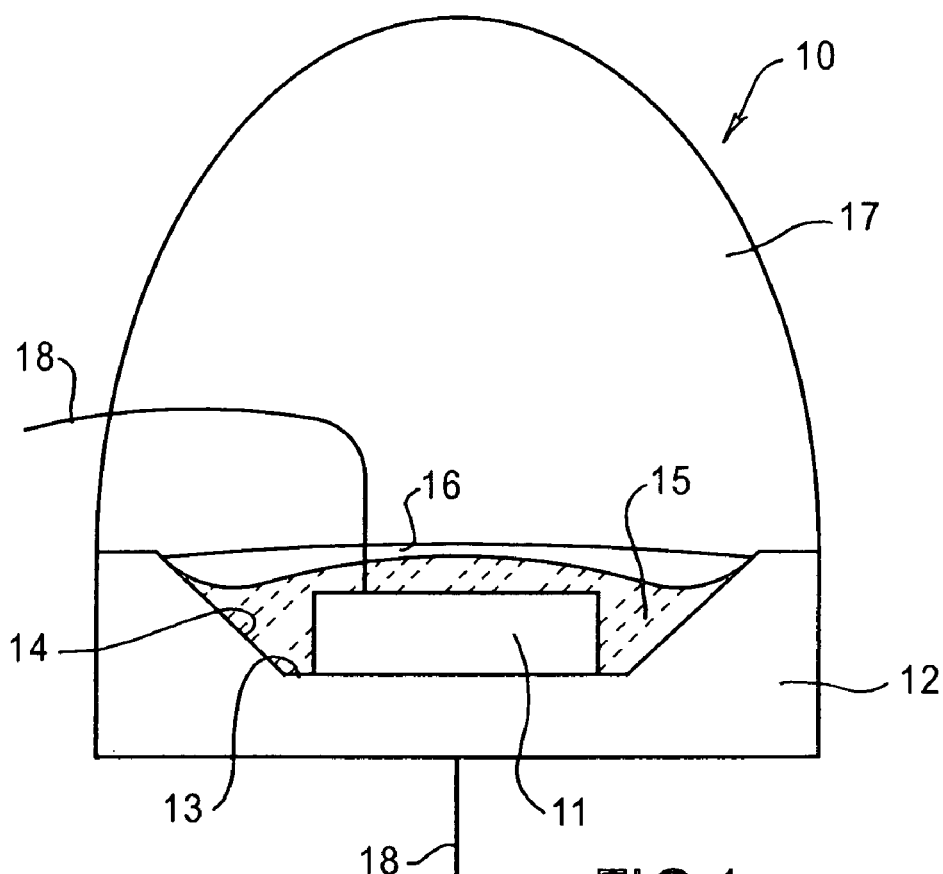
FIG. 1 illustrates a prior art light emitting device having a phosphor/epoxy layer located over a light emitting die.

The LED device of the prior art, illustrated in FIG. 1, shows a device 10 used to produce white light from a blue emitting die 11. Blue die 11 is provided by a substantially rectangular tab of gallium nitride (GaN) substrate bonded to the surface of a reflector cup support 12, typically of lead, or a PCB frame. As FIG. 1 shows, reflector cup 12 provides a substantially planar base surface 13 and sloping wall 14, which, for light reflecting purposes, has an overall frusto-conical shaping. The LED die 11 is arranged approximately centrally on the planar base surface of the reflector cup as shown in the figure, and the device operates to provide a very high intensity of upward-directed light.

Contact wires 18 are applied to the device as shown, in order to apply electrical power to die 11.

An amount of Cerium activated Yttrium Aluminium Garnet (YAG:$Ce^{3+}$) phosphor in an epoxy matrix 16 is poured over LED die 11, and the entire construction then over-moulded with a conventional clear epoxy lens 17. The YAG:$Ce^{3+}$ phosphor re-emits broad band yellow-green light and some unabsorbed original blue light which is transmitted through phosphor layer 15, to give a perceived combination radiation of white light.

The addition of different luminescent/fluorescent layers in combination with a blue die light source permits light emission at various different wavelengths. For example, possible fluorescent materials include the following phosphors available from Osram Sylvania Inc. (Danvers, Mass.): Ag:ZnS (blue); CuAuAl:ZnS (green); CuAl:ZnS (green); Mg4(F)Ge05:Mn (red); Ce:YAG (yellow-green).

Since the specific gravity of the phosphor particles is significantly higher than the epoxy material in which they are carried, the phosphor material begins to settle within the epoxy matrix to follow the contours of the substrate. A large proportion of the phosphor material 15 settles in the annular region between the sides of the LED die 11 and the conical wall 14 of the reflector cup 12, only a relatively thin layer remaining overlying LED die 11, as FIG. 1 illustrates. When the phosphor material has settled and the epoxy cured, the result is a two-layer coating, of clear epoxy layer 16 overlying phosphor dye layer 15.

As mentioned above, this can lead to some degree of colour non-uniformity in the radiation pattern emitted from the LED. For example in the construction of a semiconductor device consisting of a blue LED with YAG:$Ce^{3+}$ phosphor, a yellow ring can be detected around the perimeter of the radiation pattern. Viewing the LED lamp on-axis and off-axis produces different colours.

Figure 3:
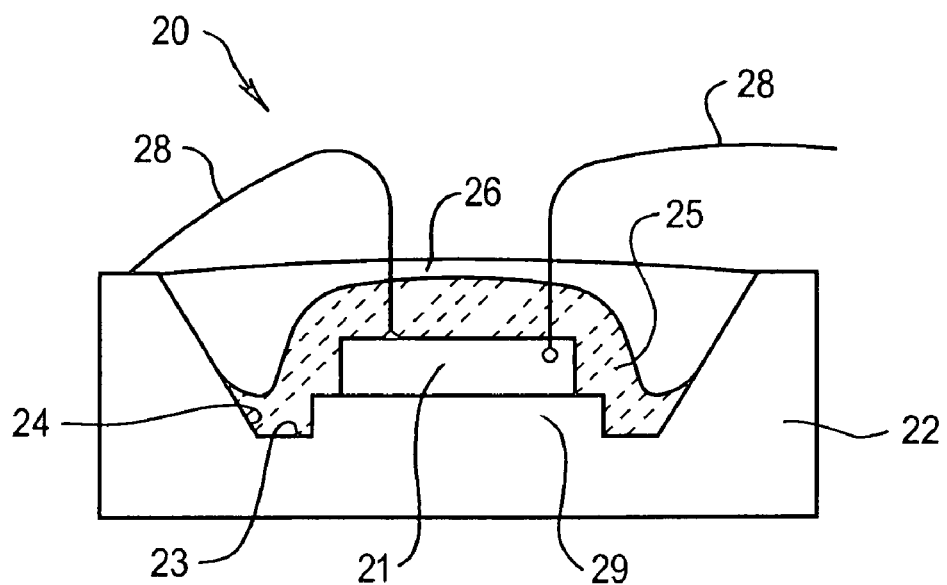
FIG. 3 illustrates a light emitting device according to the invention.

The device according to the invention is illustrated in FIG. 3 by use of similar reference numerals to those used with respect to the prior art device of FIG. 1, each reference numeral increased by 10 for corresponding components. The LED device 20 features a modified construction of reflector cup 22, having a planar projecting portion defining a raised platform 29 approximately centrally within base 23 of reflector cup 22. The raised platform forms the supporting base for LED die 21.

LED die 21 is mounted on and bonded to raised platform 29, and electrical connection wires 28 attached to the die to provide electrical power. A luminescent material is then applied over LED die 21, in the known form of an epoxy material 26 containing inorganic phosphor powder which has been premixed with epoxy 26 to form a viscous slurry. The applied material flows over die 21 and platform 29 to fill reflector cup 22. Due to the outer annular trough provided by reflector cup base 23, inclined wall 24, and the sides of raised platform 29, the particulate phosphor material 25 is able to settle to a lower position toward the periphery of reflector cup 22 than would otherwise be the case, as FIG. 3 shows. The thickness of the dye material around the sides of LED die 21 is therefore significantly reduced in comparison with that provided in an equivalent prior art device. In fact, by careful selection of the dimensions of platform 29 and of the other structural components, and dependent on the physical properties of materials 25 and 26, the thickness of the luminescent material may be approximately constant over the entire surface and sides of die 21. Once epoxy layer 26 has cured, an epoxy lens (not shown) is then applied over the device in a manner known from the prior art.

In a form of the invention tested by the inventor, a rectangular raised platform 29 was used, supporting a similarly shaped LED die 21. The LED die used was approximately 0.1 mm in thickness, supported on a platform 29 slightly larger than die 21 (by about 0.1 mm on all sides) to ensure sufficient phosphor material 25 is able remains around die 21. Clearly platform 29 can be shaped and sized as appropriate to match the shape and dimensions of die 21.

Reflector cup 22 is made from copper or steel or other metal, on which a reflective silver layer is typically applied. The silver layer also coats platform 29, since light does travel downwardly from LED die 21, and should be reflected back in an upward direction to increase the efficiency of device 20. Typically the entire reflector cup, including platform 29, is stamped into the substrate material by means of a stamping tool, and LED die 21, as well as the electrical lead wires 28, are then introduced to the device.

Figure 4:
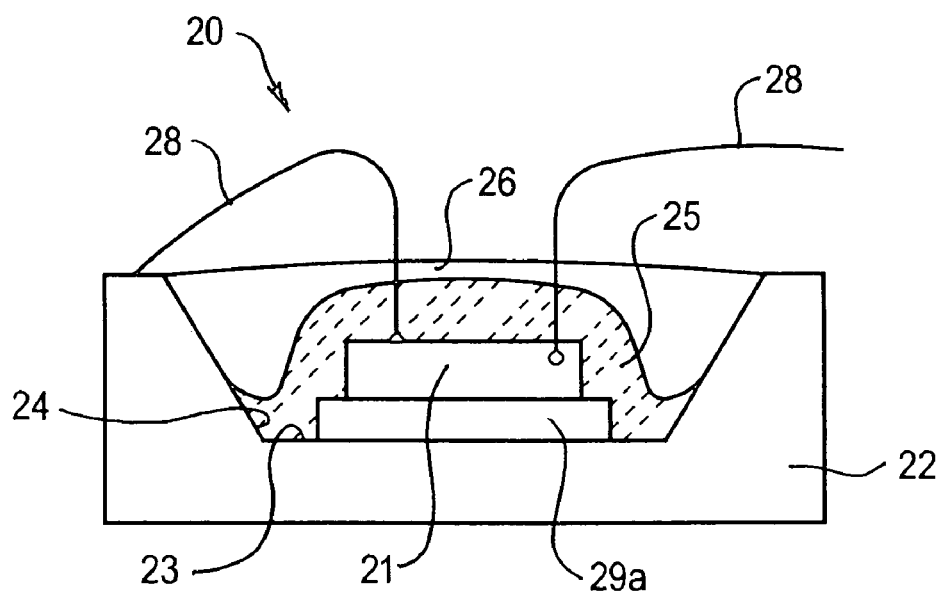
FIG. 4 illustrates a light emitting device according to the invention in a further embodiment.

A further embodiment of the invention, shown in FIG. 4, provides the same geometry of the device of FIG. 3, but involves the use of a raised platform 29a provided by a separate rectangular platform component as shown. Platform 29a is bonded to base 23 of the reflector cup 22. The advantage of this embodiment is that a separate material can be used to provide platform 29a if different characteristics of the reflector cup components are desirable. For example, a diamond platform 29a may be used with a high power LED device for purposes of improved heat dissipation away from the LED die 21. Molybdenum, a less expensive alternative to diamond, may also be used for this purpose.

It is to be noted in regard to FIGS. 3 and 4 that the epoxy lens overlying the components of the LED device is not shown, but that any suitable such lens may be used with the device of the invention, the shape being selected to meet the desired optical radiation pattern. UV-stable epoxy plastic materials, as conventionally used, are appropriate for this purpose. The epoxy lens may incorporate additional coloured or fluorescent material to modify light transmission from the device. Such "doping" of LED lenses is described further in U.S. Pat. No. 5,847,507, the entire contents of which are incorporated herein by reference.

Figure 2:
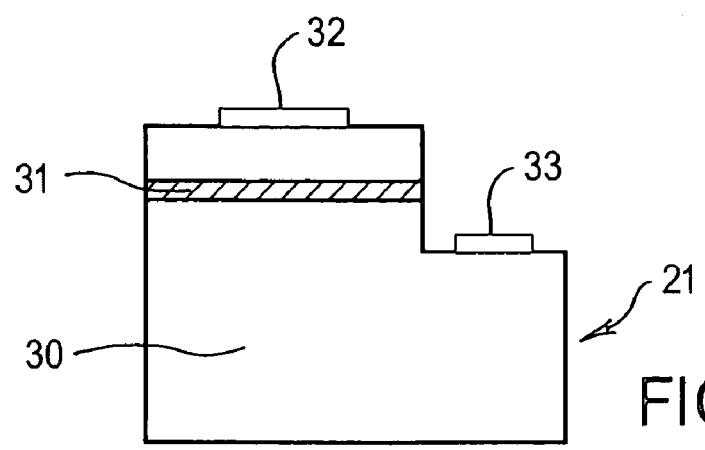
FIG. 2 shows in simplified cross-section a GaN LED, suitable for use in the device of the present invention.

A conventional LED die is illustrated in FIG. 2, as an example of the type of LED suitable for use in the device of the invention, and arranged to be energised to emit light at a prescribed wavelength by applying an appropriate voltage between electrical terminal leads. The LED die has a p-n junction 31 defined between layers of semi-conductor crystal 30, in this case gallium nitride (GaN). In the figure, active junction 31 comprises p-type top layers and n-type bottom layers. The positive electrical terminal 32 is provided by an upper conducting pad, whilst the negative electrical terminal is provided by a second conducting pad 33 contacting the lower semiconductor crystal layer.

Although the device of the invention as described above is directed towards the use of LED dies, it is to be understood that other analogous light sources, such as laser diodes, can also be used in the context of the invention.

It should be understood that the above disclosure describes only preferred embodiments of the invention, and the various modifications, alterations and/or additions may be made thereto without departing from the spirit and scope of the invention.

The invention claimed is:

1. A light emitting device, comprising:
   a base substrate with a cavity and a trough to form a reflective cup;
   a projecting platform at the base of the cavity, the projecting platform having vertical walls;
   a light emitter mounted on the projecting platform, the light emitter being smaller in outline than the projecting platform; and
   a coating having an adhesive material and particles of another substance, wherein the coating is a viscous slurry when applied over and in direct contact with the light emitter in the cavity, and hardens when cured after being applied over the light emitter in the cavity, wherein when the coating, when being a viscous slurry, is applied over the light emitter, the platform, the cavity, and the trough allow the particles in the coating to be evenly settled on and around the light emitter within the cavity before the coating is cured, resulting in an evenly dispersed, uniform thickness particle coating over the light emitter, the thickness of the particle coating being constant with respect to the light emitter.

2. The device according to claim 1, wherein the platform is formed as an integral part of the base substrate.

3. The device according to claim 1, wherein the platform is a discrete component attachable to the base substrate.

4. The device according to claim 3, wherein the platform and the base substrate are fabricated from different materials.

5. The device according to claim 4, wherein the base substrate comprises a metal and the platform comprises a material able to efficiently dissipate heat generated by the light emitter.

6. The device according to claim 1, wherein the reflective cup provides reflection of light emitted by the light emitter.

7. The device according to claim 6, wherein the cavity has a sloping wall which is of frusto-conical form surrounding the projecting platform, and the sloping wall and the platform are coated with a reflective material.

8. The device according to claim 1, wherein the reflective material is silver.

9. The device according to claim 1, wherein the platform allows the particles within the coating to settle to a lower position with respect to the light emitter towards the periphery of the base of the cavity before the coating is cured, thus allowing the thickness of the coating that contains the settled particles to remain constant over the entire surface and sides of the light emitter.

10. The device according to claim 1, wherein the particles are of fluorescent or luminescent substance to absorb light of one wavelength and re-emit light of a different wavelength.

11. The device according to claim 10, wherein the fluorescent or luminescent substance is phosphor and the adhesive material is epoxy.

12. The device according to claim 1, further comprising a lens positioned over the light emitter and the coating material to focus the emitted light from the light emitter.

13. The device according to claim 1, wherein the light emitter is selected from the group of an LED and a laser diode.

\* \* \* \* \*

UNITED STATES PATENT AND TRADEMARK OFFICE
CERTIFICATE OF CORRECTION

PATENT NO.        : 7,129,638 B2                                          Page 1 of 1
APPLICATION NO.   : 09/924653
DATED             : October 31, 2006
INVENTOR(S)       : Kee Yean Ng It is certified that error appears in the above-identified patent and that said Letters Patent is hereby corrected as shown below:

Title Pg, Item (75) (Inventor) Line 1, delete "Ke Yean Ng" and insert -- Kee Yean Ng --;

Item (56), Column 2, (Other Publications), Line 4, delete "inventoe(s):" and insert -- Inventor(s): --.

Signed and Sealed this

First Day of June, 2010

David J. Kappos
*Director of the United States Patent and Trademark Office*